(12) United States Patent
Hoang et al.

(10) Patent No.: US 7,786,563 B1
(45) Date of Patent: Aug. 31, 2010

(54) STACKING MULTIPLE DEVICES USING SINGLE-PIECE INTERCONNECTING ELEMENT

(75) Inventors: Phan Hoang, Placentia, CA (US); Chinh Nguyen, Irvine, CA (US); Anthony Tran, Fountain Valley, CA (US); Tung Dang, Tustin, CA (US)

(73) Assignee: Virtium Technology, Inc., Rancho Santa Margarita, CA (US)

( * ) Notice: Subject to any disclaimer, the term of this patent is extended or adjusted under 35 U.S.C. 154(b) by 317 days.

(21) Appl. No.: 11/824,168

(22) Filed: Jun. 28, 2007

(51) Int. Cl.
*H01L 23/02* (2006.01)
(52) U.S. Cl. .................. 257/686; 257/783; 257/734; 257/E23.036; 257/E21.524
(58) Field of Classification Search .......... 257/734, 257/783, 784, 686, E23.036, E21.524; 438/618, 438/584, 597, 613, 193; 174/360, 250, 254; 361/719, 749, 600, 679.01, 803, 760
See application file for complete search history.

(56) References Cited

U.S. PATENT DOCUMENTS

| | | | |
|---|---|---|---|
| 2001/0048591 A1* | 12/2001 | Fjelstad et al. | 361/767 |
| 2003/0165051 A1* | 9/2003 | Kledzik et al. | 361/760 |
| 2004/0084741 A1* | 5/2004 | Boon et al. | 257/433 |
| 2006/0077644 A1* | 4/2006 | Nickerson et al. | 361/767 |

\* cited by examiner

*Primary Examiner*—Thomas L Dickey
*Assistant Examiner*—Nikolay Yushin
(74) *Attorney, Agent, or Firm*—Blakely Sokoloff Taylor & Zafman LLP (57) ABSTRACT

An embodiment of the present invention is a technique to stack multiple devices using an interconnecting element. A board has a periphery and top and bottom surfaces. The top surface has top contact pads to attach to a first device. The bottom surface is milled down to form a cavity confined by vertical walls around the periphery. The cavity fits a second device. Bottom contact pads are formed on bottom side of the vertical walls. The bottom contact pads are raised with respect to the bottom side of the vertical walls. Traces internal to the board connect the bottom contact pads to the top contact pads.

21 Claims, 7 Drawing Sheets

STACKING MULTIPLE DEVICES USING SINGLE-PIECE INTERCONNECTING ELEMENT

BACKGROUND

1. Field of the Invention

Embodiments of the invention relate to the field of packaging, and more specifically, to semiconductor packaging.

2. Description of Related Art

Demands for high density boards in microprocessor systems have created many challenges to the board assembly process. Among several methods, stacking multiple integrated circuit (IC) devices saves a significant amount of space on printed circuit board (PCB).

The next generation memory modules run at very high frequencies such as the Double Data Rate 2 (DDR2) dynamic random access memory (DRAM). The operating frequencies may range from 133 MHz to 1 GHz or higher. The packaging of these devices needs to be changed to more advanced packaging techniques such as Ball Grid Array (BGA) to maintain performance characteristics. Existing techniques to stack multiple devices in other chip packages are not applicable to the BGA packaging. Furthermore, even for other chip packages, existing techniques have a number of disadvantages such as mechanical weakness, low signal integrity, high manufacturing costs, etc.

Therefore, there is a need to have an efficient technique to stack multiple IC devices.

BRIEF DESCRIPTION OF THE DRAWINGS

Embodiments of invention may best be understood by referring to the following description and accompanying drawings that are used to illustrate embodiments of the invention. In the drawings.

DESCRIPTION

An embodiment of the present invention is a technique to stack multiple devices using an interconnecting element. A board has a periphery and top and bottom surfaces. The top surface has top contact pads to attach to a first device. The bottom surface is milled down to form a cavity confined by vertical walls around the periphery. The cavity fits a second device. Bottom contact pads are formed on bottom side of the vertical walls. The bottom contact pads are raised with respect to the bottom side of the vertical walls. Traces internal to the board connect the bottom contact pads to the top contact pads In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

An embodiment of the present invention is a technique to stack multiple devices, such as BGA devices using a milled down PCB as an interconnecting element. A board has a top surface with contact pads to attach to a first device such as a BGA memory device. The board has a bottom surface which is milled down to have a step-down area as a cavity to fit a second device. The milled down bottom surface has vertical walls. The bottom sides of the vertical walls have bottom contact pads. Internal vias and traces connect the bottom contact pads to the top contact pads. The interconnecting element is a single-piece board. Therefore, it is rigid, solid, and is mechanically and thermally stable.

The bottom contact pads are raised pads with respect to the bottom sides of the vertical walls. They are formed within the surface of the bottom sides to allow solder to wrap around for rugged and reliable solder connections. In addition, they provide control for co-planarity when the interconnecting element is attached to a flat surface such as to PCB.

The interconnecting element has internal metal plane for efficient heat transfer when devices are powered up. The bottom surface in the cavity has an adhesive layer to attach to the second device. The adhesive layer provides control for co-planarity and additional heat transfer.

Figure 1:
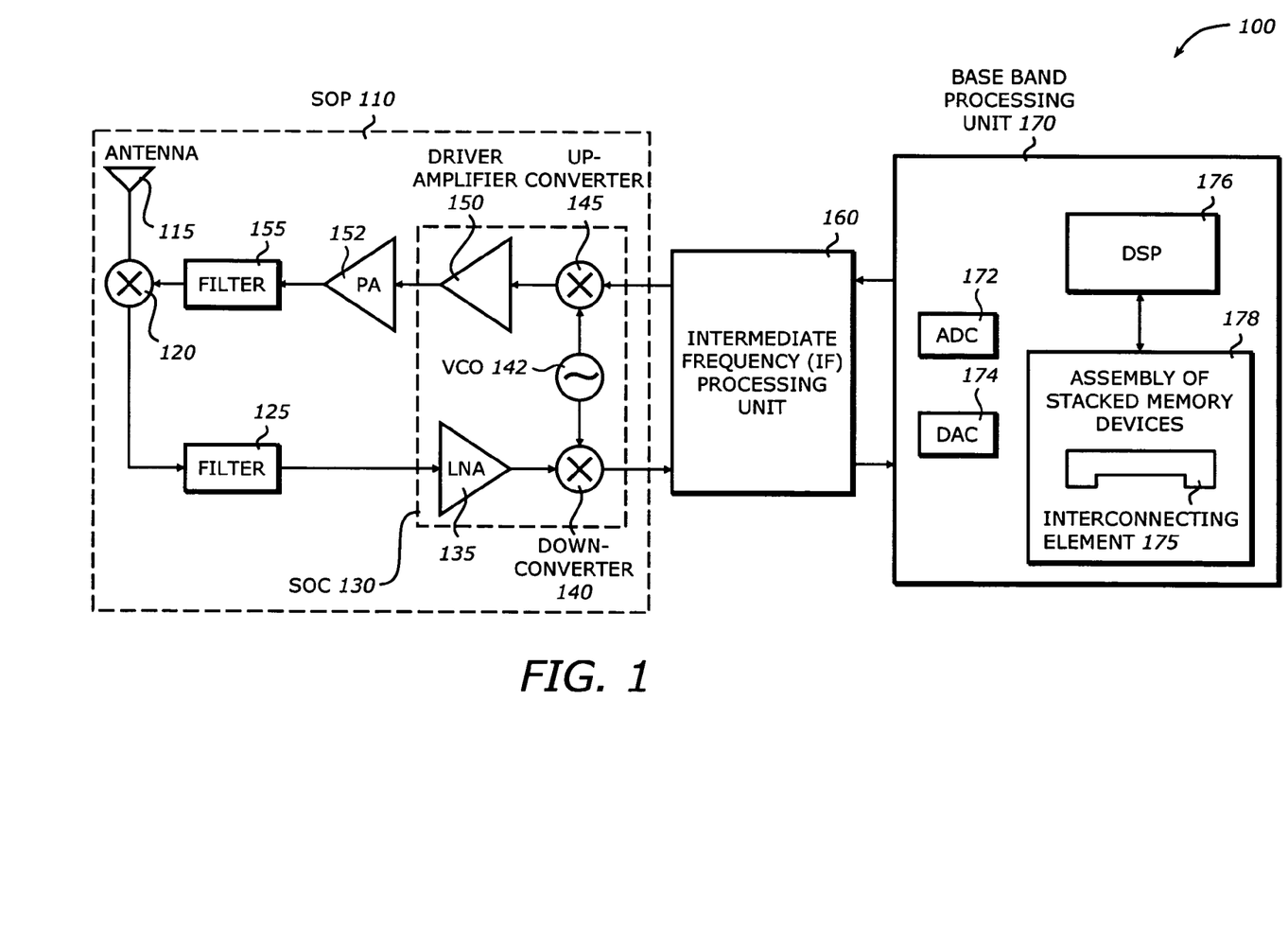
FIG. 1 is a diagram illustrating a system in which one embodiment of the invention may be practiced.

FIG. 1 is a diagram illustrating a system 100 in which one embodiment of the invention may be practiced. The system 100 represents a mobile communication module. It includes a system on package (SOP) 110, an intermediate frequency (IF) processing unit 160, and a base-band processing unit 170.

The SOP 110 represents the front end processing unit for the mobile communication module. It is a transceiver incorporating on-package integrated lumped passive components as well as radio frequency (RF) components. It includes an antenna 115, a duplexer 120, a filter 125, a system-on-chip (SOC) 130, a power amplifier (PA) 152, and a filter 155.

The antenna 115 receives and transmits RF signals. The RF signals may be converted to digital data for processing in subsequent stages. It may be designed in compact micro-strip and strip-line for L and C-band wireless applications. The duplexer 120 acts as a switch to couple the antenna 115 to the receiver and the transmitter to the antenna 115. The filters 125 and 155 may be C-band LTCC-strip-line filter or multilayer organic lumped-element filter at 5.2 GHz and narrowband performance of 200 MHz suitable for the Institute of Electrical and Electronic Engineers (IEEE) 802.11 wireless local area network (WLAN). The SOC 130 includes a low noise amplifier (LNA) 135, a down converter 140, a local voltage controlled oscillator (VCO) 142, an up converter 145, and a driver amplifier 150. The LNA 135 amplifies the received signal. The down converter 140 is a mixer to convert the RF signal to the IF band to be processed by the IF processing unit 160. The up converter 145 is a mixer to convert the IF signal to the proper RF signal for transmission. The VCO 142 generates modulation signal at appropriate frequencies for down conversion and up conversion. The driver amplifier 150 drives the PA 152. The PA 152 amplifies the transmit signal for transmission.

The IF processing unit 160 includes analog components to process IF signals for receiving and transmission. It may include a band-pass filter and a low pass filter at suitable frequency bands. The filter may provide base-band signal to the base-band processing unit 170. The base-band processing unit 170 may include an analog-to-digital converter (ADC) 172, a digital-to-analog converter (DAC) 174, a digital signal processor (DSP) 176, and a memory assembly 178. The ADC 172 and the DAC 174 are used to convert analog signals to digital data and digital data to analog signal, respectively. The DSP 176 is a programmable processor that may execute a program to process the digital data. The DSP 176 may be coupled to the front end processing unit via the IF processing unit 160 and/or the base-band processing unit 170 to process the digital data. The memory assembly 178 may contain code and/or data used by the DSP 176. The memory assembly 178 may be an assembly of stacked memory devices for space efficient packaging. The memory devices in the memory assembly 178 may be flash memory, dynamic random access memory (DRAM), static RAM, or any combination of them. In one embodiment, the memory devices are packaged using BGA technology. They are stacked using one or more interconnecting elements 175.

Figure 2A:
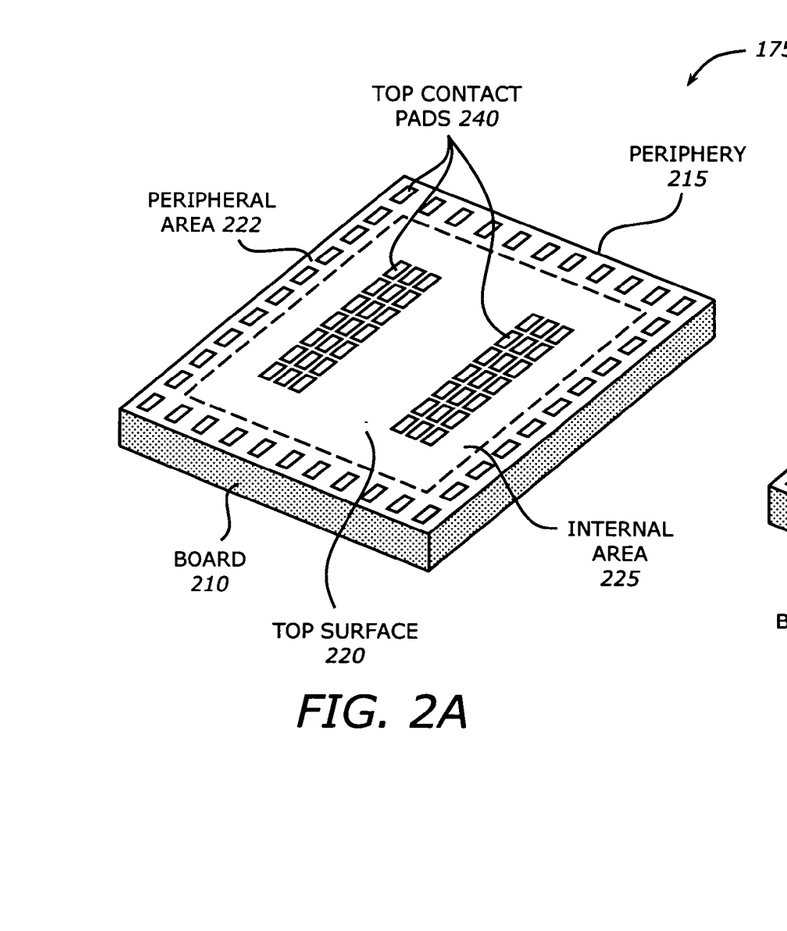
FIG. 2A is a diagram illustrating top view of an interconnecting element according to one embodiment of the invention.

FIG. 2A is a diagram illustrating top view of the interconnecting element 175 according to one embodiment of the invention. The interconnecting element 175 includes a board 210 and associated contact pads and traces for interconnections. The board 210 may be a PCB made of a flame retardant or resistant (FR) woven glass reinforced epoxy resin of type 4 (FR-4). It has a periphery 215. The periphery 215 may be patterned according to the devices that are stacked using the interconnecting element 175. In one embodiment, the periphery 215 is of a rectangular shape that fits a typical BGA memory device.

Figure 2B:
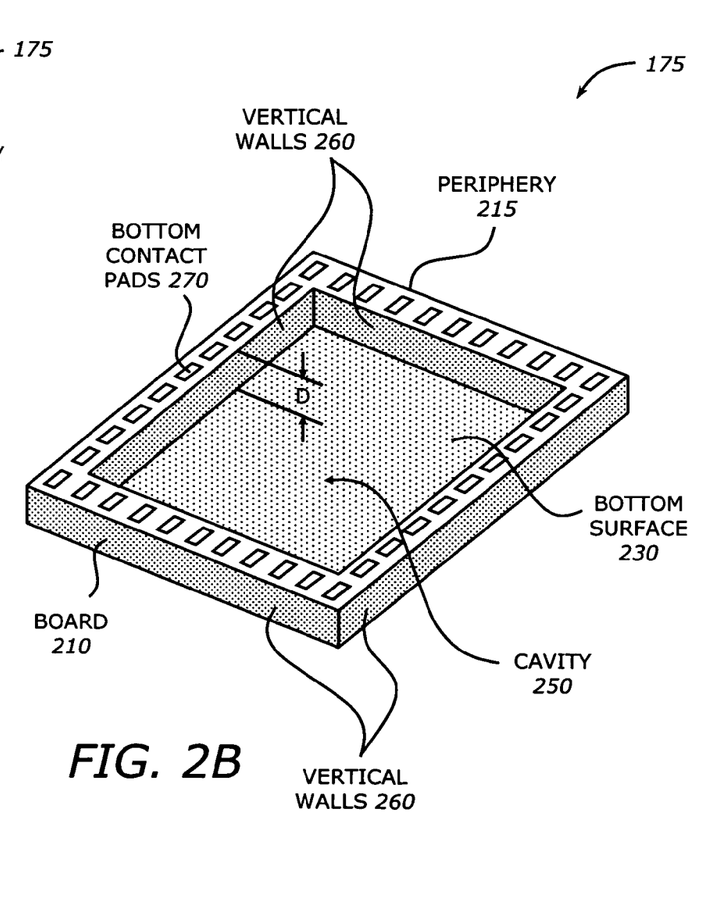
FIG. 2B is a diagram illustrating bottom view of an interconnecting element according to one embodiment of the invention.

The top view of the interconnecting element 175 shows a top surface 220. The top surface 220 has top contact pads 240. The top contact pads 240 may be made of metal such as copper to provide contacts to attach to a device on top of the interconnecting element 175. The top contact pads 240 are arranged in two areas: a peripheral area 222 and an internal area 225. The peripheral area 222 includes contact pads that are arranged around the periphery 215 and are used to attach to another interconnecting element or to interconnect with bottom contact pads at the bottom surface as shown in FIG. 2B. The internal area 225 includes contact pads that are patterned or arranged to match to the contact pads of the BGA device that is attached to the top surface 220.

The device to be attached to the top surface may be packaged with BGA package. The BGA package may be of any type, having any ball counts and pitches. Examples of the ball count may be 49, 56, 100, 132, 144, 208, 256, 272, 324, 388, 416, 484, 516, 672, 676, 680, 900, 1152, or 1156. Examples of the pitches may include 1.27 mm, 1.00 mm, 0.8 mm, and 0.5 mm. The ball diameters may be of any size such as 0.45 mm.

FIG. 2B is a diagram illustrating bottom view of the interconnecting element 175 according to one embodiment of the invention. The board 210 has a bottom surface 230 and bottom contact pads 270.

The bottom surface 230 is milled down to form a cavity 250. An area of the bottom surface 230 is removed or milled down to form the cavity 250. The cavity 250 is confined by the vertical walls 260 around the periphery 215. Typically, the cavity 250 takes up the shape of the periphery 215, e.g., a rectangular shape, to fit a device. The depth D of the cavity 250 fits the height of the device. The device enclosed in the cavity may be a BGA device with the same packaging as the device attached to the top surface.

The bottom contact pads 270 are formed on the bottom side of the vertical walls 260. In other words, they are formed around the periphery 215. Typically, the bottom contact pads 270 are aligned with the top contact pads 240 in the peripheral area 222. Vias or traces may be formed internal to the board 210 to provide connections between the bottom contact pads 270 with the top contact pads 210 in the peripheral area 222. For memory devices, there may be common signal groups such as clock, command, address, data strobe, and data. The internal traces connect these signal groups together. Separate control signals for individual BGA devices may be connected by separate signal traces that are formed on the motherboard or an attachment board shown in FIG. 4B. The bottom contact pads 270 are raised pads with respect to the surface of the bottom side of the vertical walls. They are formed within the surface of the bottom side so that solder may be applied to wrap around to form solid, rugged, and reliable contacts.

Figure 3:
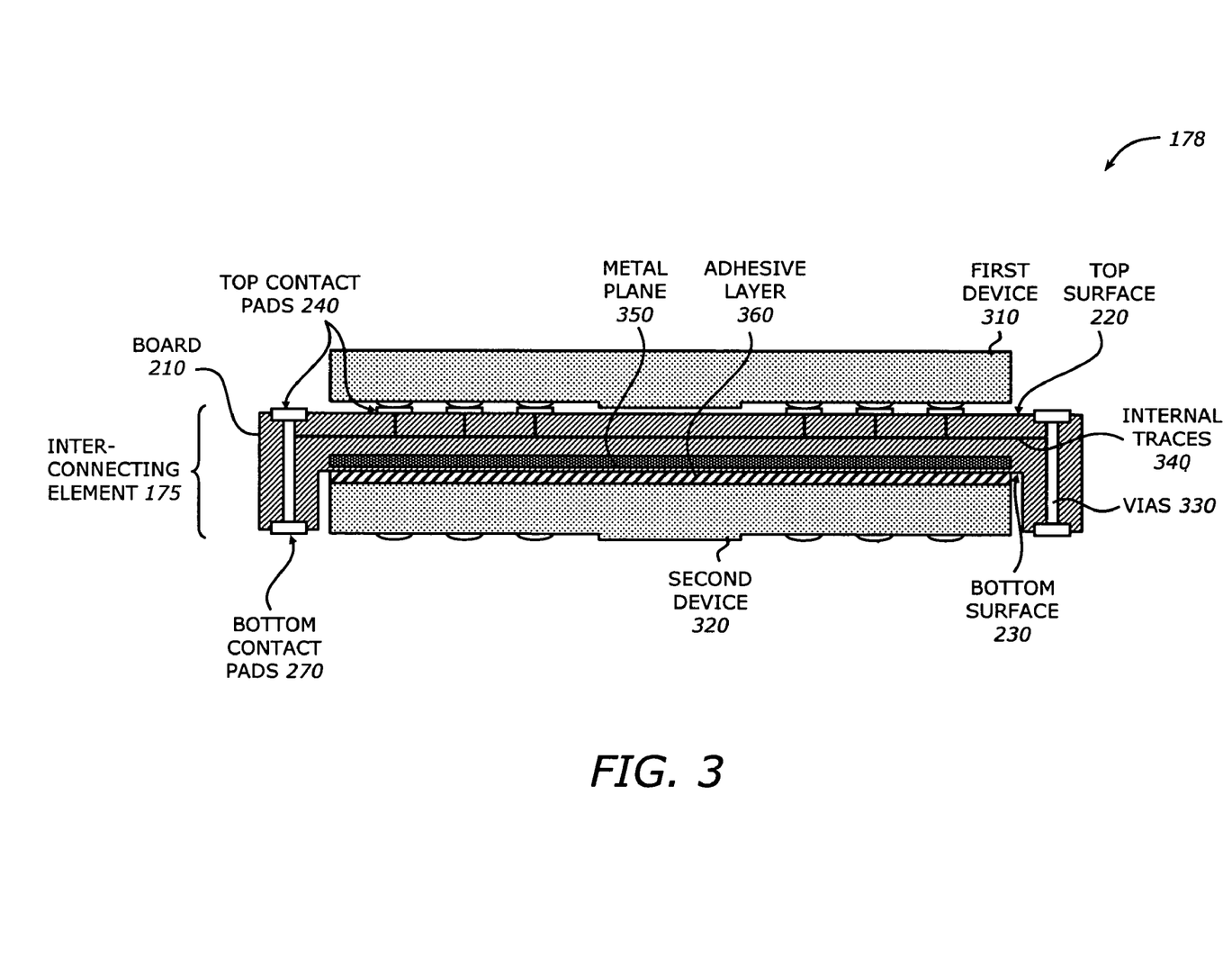
FIG. 3 is a diagram illustrating an assembly of stacked devices according to one embodiment of the invention.

FIG. 3 is a diagram illustrating the assembly 178 of stacked devices according to one embodiment of the invention. The assembly 178 includes the interconnecting element 175, a first device 310, and a second device 320.

The interconnecting element 175 is attached to the first device 310 on the top surface 220 and to the second device 320 on the bottom surface 230 in the cavity 250. The board 210 of the interconnecting element 175 includes vias 330 that are formed internally to connect the bottom contact pads 270 and the top contact pads 240 through the vertical walls 260 (FIG. 2B). The vias 330 may be formed by laser drilling for precision and to minimize the overall package size. The board 210 may also include a metal plane 350 between the top surface 220 and the bottom surface 230 to transfer heat.

The interconnecting element 175 includes an adhesive layer 360 deposited on the bottom surface 230. The adhesive layer 360 is used to attach to the second device 320. The adhesive layer 360 is also used to provide control co-planarity when the assembly 178 is attached to a PCB. The adhesive layer 360 may be made of any suitable thermal adhesive or grease that may provide good adhesive and thermal properties. It may have a thermal conductance ranging approximately from 0.5 W/m-K to 1.3 W/m-K, and a coefficient of thermal expansion (CTE) ranging from 60 ppm/° C. to 300 ppm/° C. The viscosity may be paste to allow easy dispensing and provide good co-planarity control. Since the bottom surface is milled, it may be uneven due to imperfection in the milling or drilling process. The adhesive layer 360 helps even out the surface to produce good co-planarity. This may be achieved by having the vertical walls of equal heights. The co-planarity may be further enhanced by the solder that wraps around the bottom contact pads 270 when the interconnecting element 175 is attached to a flat surface such as a motherboard or an attachment board as shown in FIG. 4B.

The first device 310 may be any device having a BGA package. The first device 310 is attached to the top surface 220 of the interconnecting element 175 via the top contact pads 240 in the internal area 225 (FIG. 2A). The top surface of the second device 320 is attached to the interconnecting element 175 via the adhesive layer 360. The second device 320 is fit within the cavity 250. The first and second devices 310 and 320 may be any semiconductor devices having any suitable package type. In one embodiment, they are memory devices having BGA package.

Figure 4A:
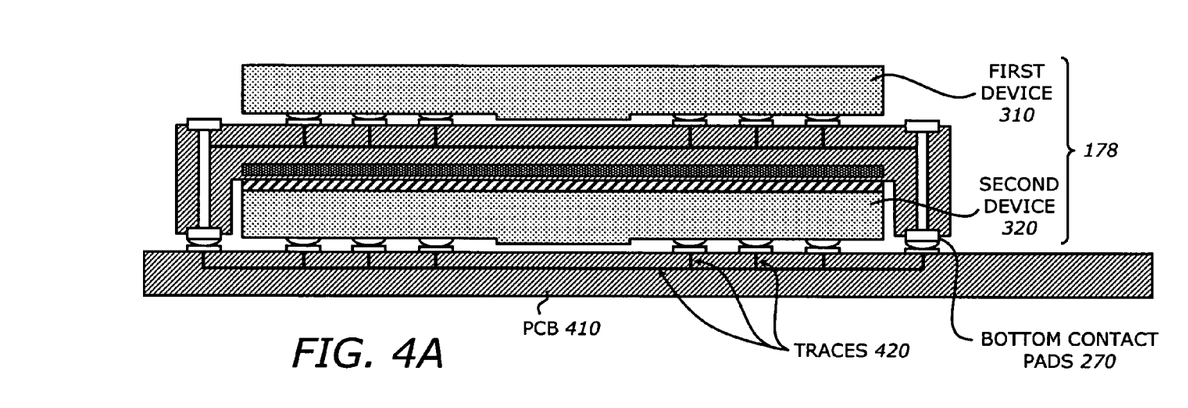
FIG. 4A is a diagram illustrating attaching the assembly to a board according to one embodiment of the invention.
Figure 4B:
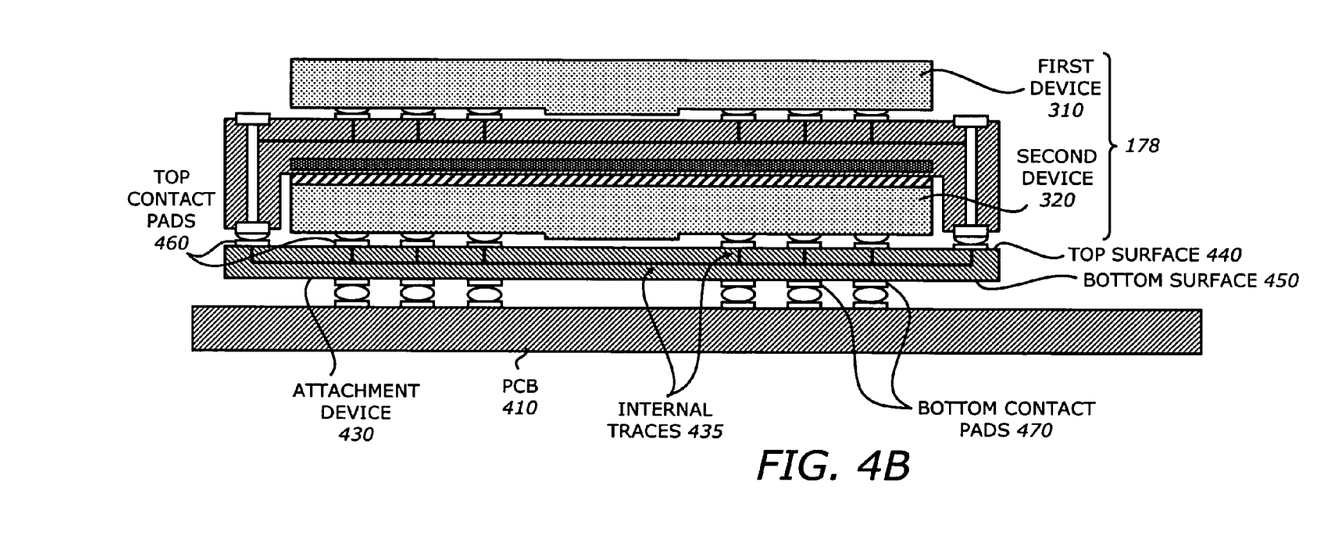
FIG. 4B is a diagram illustrating an attachment board according to one embodiment of the invention.

FIG. 4A is a diagram illustrating attaching the assembly to a board according to one embodiment of the invention. The assembly 178 is attached to a PCB 410. The PCB 410 may be a motherboard or any other board that has interconnections to other devices that are connected to the stacked devices in the assembly 178.

The PCB 410 may have internal traces 420 that connect the contacts of the second device 320 to the bottom contact pads 270. The internal traces 420 therefore connect the contacts of the first device 310 and the contacts of the second device 320. When the first device 310 and the second device 320 are memory devices having common signal groups such as clock, address, command, data strobe, and data, the internal traces 420 connect these contacts altogether to form an array of memory devices as commonly connected in a typical memory array interconnection. The PCB 410 may also have traces corresponding to the separate control lines for individual BGA device in the assembly. For N devices, there may be N separate control lines.

FIG. 4B is a diagram illustrating an attachment board 430 according to one embodiment of the invention. The attachment board 430 is an additional board to provide interconnections for the first device 310 and the second device 320. In addition, the board 430 also provides a compact footprint as the footprint of the first device 310 or the second device 320.

The attachment board 430 has a top surface 440 and a bottom surface 450. The top surface 440 has top contact pads 460 that are arranged to match or correspond to the bottom contact pads 270 of the interconnecting element 175 and the contact pads or bumps of the second device 320. The bottom surface 450 has bottom contact pads 470 that match with the contact pads of the first device 310, the second device 320, or any other suitable contact pattern. The bottom contact pads 470 may then be attached to the board 410 via soldering.

The attachment board 430 includes internal traces 435 that connect the contacts of the second device 320 with the bottom contact pads 270 of the interconnecting element 175. Since the bottom contact pads 270 are connected to the contacts of the first device 310, the internal traces 435 effectively connect the contacts of the first device 310 to the second device 320. When the first device 310 and the second device 320 are memory devices having common signal groups such as clock, address, command, data strobe, and data, the internal traces 435 connect these contacts altogether to form an array of memory devices as commonly connected in a typical memory array interconnection. The attachment board 430 may also have traces corresponding to the separate control lines for individual BGA device in the assembly. For N devices, there may be N separate control lines.

The attachment board 430 may be a PCB made of similar material as the interconnecting element 175. Its size may be matched to the size of the board 210 of the interconnecting element 175. Together with the interconnecting element 175, it provides a compact packaging of stacked devices to occupy only a small footprint equivalent to a single device such as the first device 310 or the second device 320.

Figure 5:
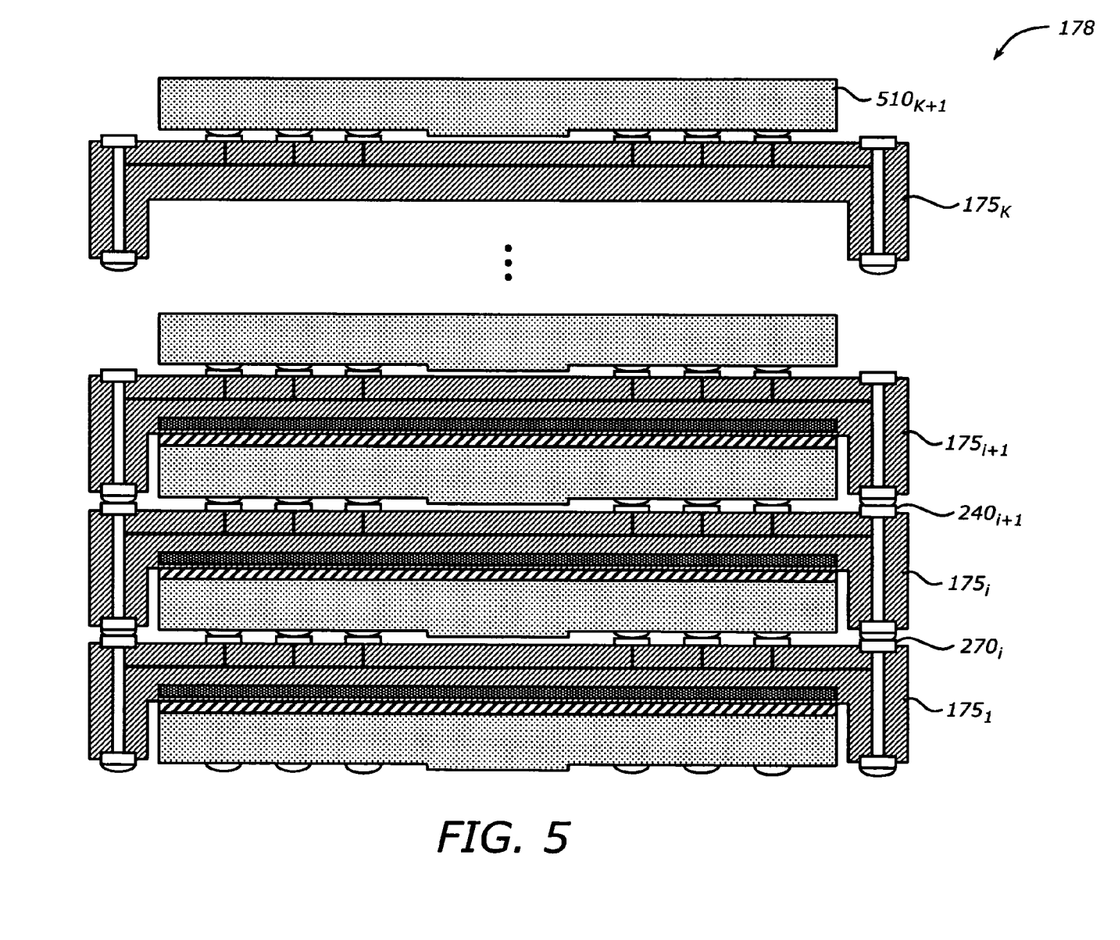
FIG. 5 is a diagram illustrating an assembly of stacked multiple devices according to one embodiment of the invention.

FIG. 5 is a diagram illustrating an assembly 178 of stacked multiple devices according to one embodiment of the invention. The assembly 178 may be extended to stack more than two devices by using multiple interconnecting elements $175_i$'s.

The assembly 178 may include K interconnecting elements $175_i$'s (i=1, . . . , K) to stack K+1 devices $510_1$ to $510_{K+1}$, where K is any integer. The interconnecting elements $175_i$'s are attached one on top of the other. Each interconnecting element is attached to a device on its top surface and another device on its bottom surface inside the cavity. The bottom contact pads $270_i$ of the interconnecting element $175_i$ are attached to the top contact pads $240_{i-1}$ of the interconnecting element $175_{i-1}$. Similarly, the top contact pads $240_i$ of the interconnecting element $175_i$ are attached to the bottom contact pads $270_{i+1}$ of the interconnecting element $175_{i+1}$. In this manner, all the devices $510_1$ to $510_{K+1}$ are connected together.

The entire assembly 178 may then be attached to a PCB or a motherboard in the same manner as shown in FIGS. 4A and 4B. An attachment board 430 may be used to connect all the stacked devices together.

Figure 6A:
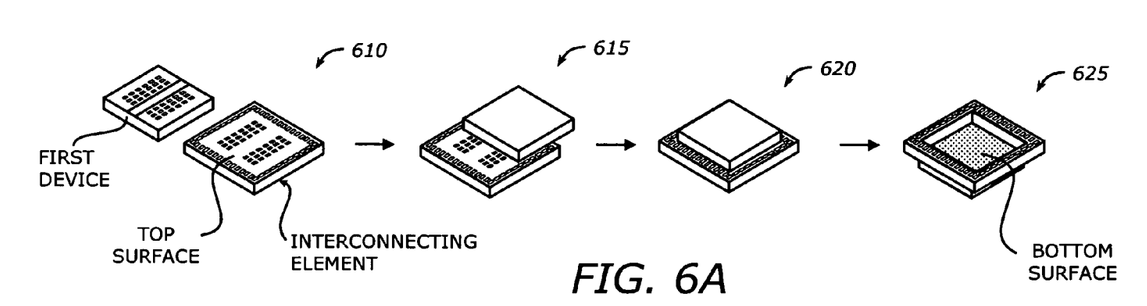
FIG. 6A is a diagram illustrating a first phase of an assembly process to stack multiple devices according to one embodiment of the invention.

FIG. 6A is a diagram illustrating a first phase 600A of an assembly process to stack multiple devices according to one embodiment of the invention.

The first phase 600A starts with preparing the first device and the interconnecting element (Block 610). Then, the first device is attached to the top surface of the interconnecting element by a pick, place and reflow procedure (Block 615). The procedure provides soldering to the contacts of the first device and the top contact pads in the internal area of the interconnecting element. Next, the attachment of the first device is finished (Block 620). This may include any cleaning or removal of excess solder. Then, the interconnecting element with the attached first device is flipped over (Block 625)

Figure 6B:
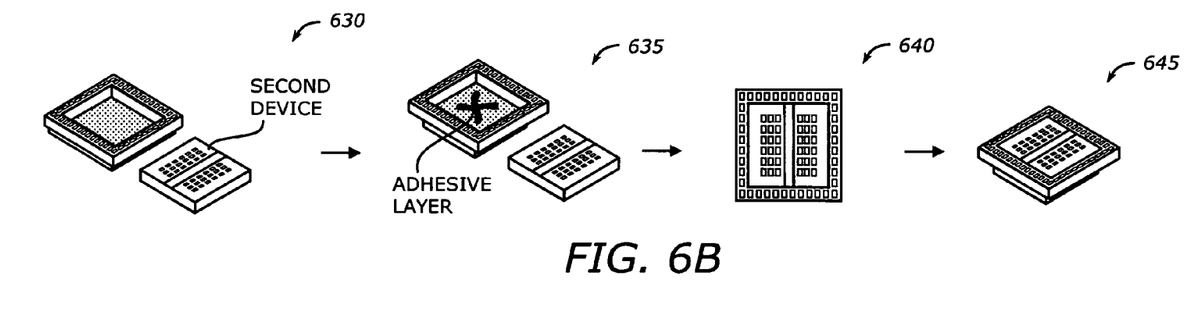
FIG. 6B is a diagram illustrating a second phase of an assembly process to stack multiple devices according to one embodiment of the invention.

FIG. 6B is a diagram illustrating a second phase 600B of an assembly process to stack multiple devices according to one embodiment of the invention.

The second phase 600B starts with a second device and the flipped over interconnecting element with the attached first device (Block 630). Then, an adhesive layer is deposited on the bottom surface of the interconnecting element (Block 635). Next, the second device is aligned and placed inside the cavity of the interconnecting element for attachment to the bottom surface via the adhesive layer (Block 640). The package may then be cured at a proper temperature. Then, the assembling of the stacked devices is finished (Block 645). This may include cleaning and removal of any excess residues.

Figure 6C:
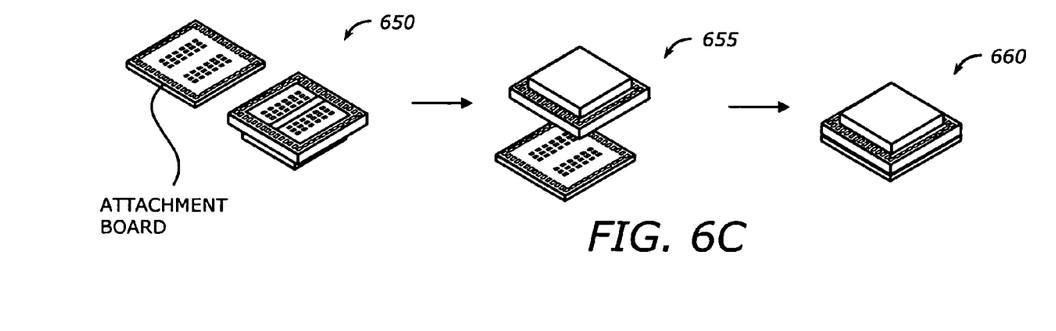
FIG. 6C is a diagram illustrating a third phase of an assembly process to stack multiple devices according to one embodiment of the invention.

FIG. 6C is a diagram illustrating a third phase 600C of an assembly process to stack multiple devices according to one embodiment of the invention. The third phase 600C may be optional.

The third phase 600C starts with the finished assembly at Block 645 and an attachment board (Block 650). Then, the finished assembly is attached to the attachment board by a pick, place, and reflow procedure (Block 655). This procedure provides soldering to the contact pads on the top surface of the attachment board and the bottom contact pads of the interconnecting element and the contacts of the second device. Next, the assembling of the entire package is finished (Block 660). This may include cleaning and remove any excess solder residues.

Figure 7:
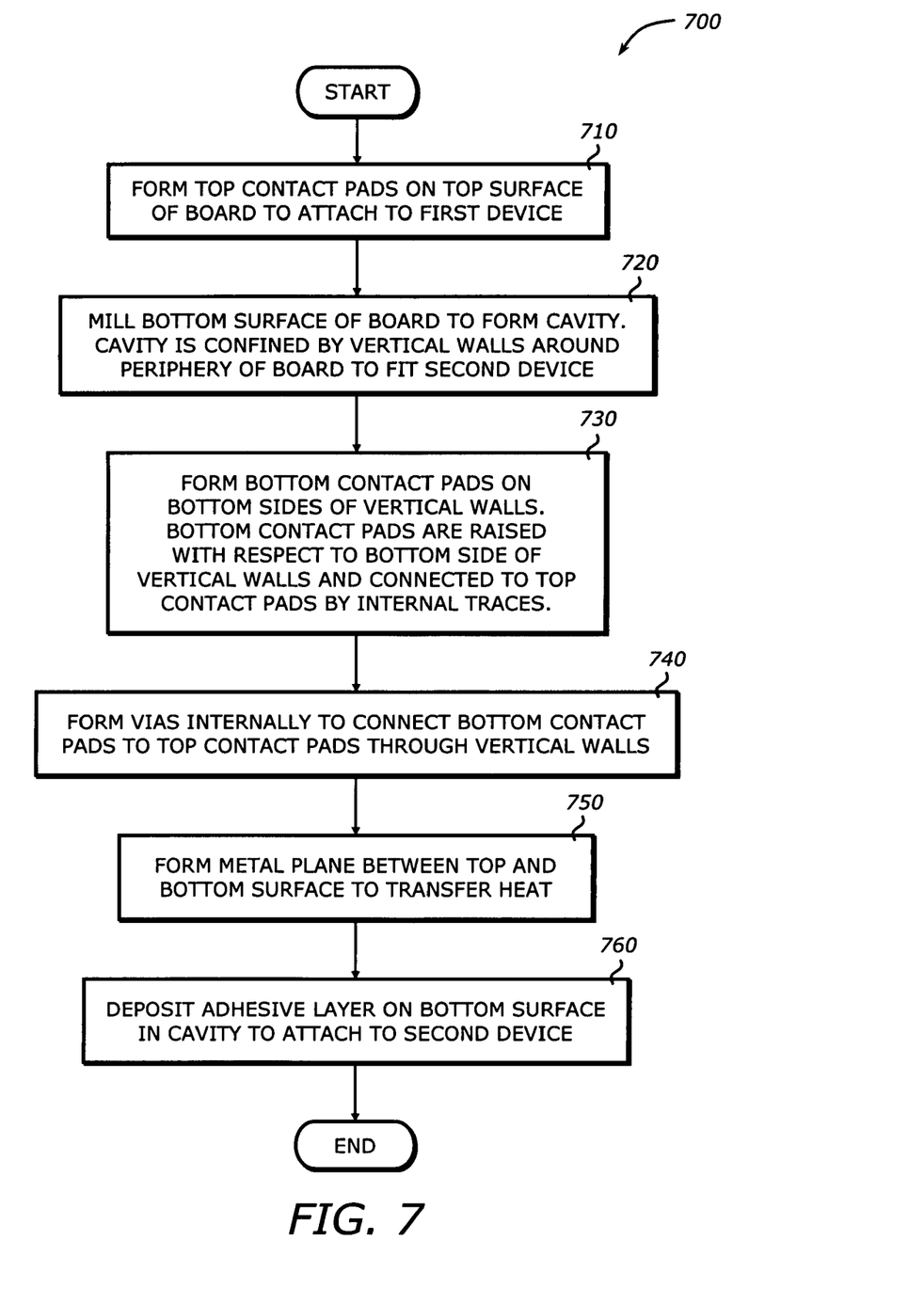
FIG. 7 is a flowchart illustrating a process to fabricate an interconnecting element to stack multiple devices according to one embodiment of the invention.

FIG. 7 is a flowchart illustrating a process 700 to fabricate an interconnecting element to stack multiple devices according to one embodiment of the invention.

Upon START, the process 700 forms top contact pads on a top surface of a board to attach to a first device (Block 710). The top contact pads may be made of copper and may occupy two areas: a peripheral area and an internal area. Next, the process 700 mills a bottom surface of the board to form a cavity at the bottom surface (Block 720). The cavity is confined by vertical walls around periphery of the board to fit a second device. The milling may be performed by removing or drill the bottom surface of the board.

Then, the process 700 forms bottom contact pads on bottom sides of the vertical walls (Block 730). The bottom contact pads are raised with respect to the bottom side of the vertical walls and connected to the top contact pads by internal traces. The bottom contact pads are formed within the bottom side to allow solder formed solidly.

Next, the process 700 forms vias internally to connect the bottom contact pads to the top contact pads through the vertical walls (Block 740). Then, the process 700 forms a metal plane between the top and bottom surfaces to transfer heat (Block 750). The metal plane may be made of copper. Next, the process 700 deposits an adhesive layer on the bottom surface in the cavity to attach to the second device (Block 760). The process 700 is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An interconnecting element comprising:
    a board having a periphery and top and bottom surfaces, the top surface having top contact pads to attach to a first device, the bottom surface forming a cavity confined by vertical walls around the periphery, the cavity fitting a second device, the board attaching to the first device on the top surface and to the second device on the bottom surface in the cavity;
    bottom contact pads formed on bottom side of the vertical walls, the bottom contact pads being raised with respect to the bottom side of the vertical walls; and
    traces internal to the board to connect the bottom contact pads to the top contact pads.

2. The interconnecting element of claim 1 wherein the board comprises:
    vias formed internally to connect the bottom contact pads and the top contact pads through the vertical walls.

3. The interconnecting element of claim 1 wherein the board comprises:
    a metal plane between the top and bottom surfaces.

4. The interconnecting element of claim 1 further comprising:
    an adhesive layer on the bottom surface in the cavity to attach to the second device.

5. The interconnecting element of claim 1 wherein the board is made of a flame retardant (FR) woven glass reinforced epoxy resin of type 4 (FR-4).

6. The interconnecting element of claim 1 wherein the top and bottom contact pads are made of copper.

7. The interconnecting element of claim 1 wherein at least one of the first and second devices is a ball grid array (BGA) device.

8. The interconnecting element of claim 1 wherein the adhesive layer provides control of co-planarity when the board is attached to a flat surface.

9. The interconnecting element of claim 1 wherein the bottom contact pads are formed within the bottom side of the vertical walls.

10. An assembly comprising:
    first and second devices; and
    an interconnecting element between the first and second devices, the interconnecting element comprising:
        a first board having a periphery and first top and bottom surfaces, the first top surface having first top contact pads to attach to the first device, the first bottom surface forming a cavity confined by vertical walls around the periphery, the cavity fitting the second device, the first board attaching to the first device on the top surface and to the second device on the bottom surface in the cavity,
        first bottom contact pads formed on bottom side of the vertical walls, the first bottom contact pads being raised with respect to the bottom side of the vertical walls, and
        traces internal to the board to connect the first bottom contact pads to the first top contact pads.

11. The assembly of claim 10 wherein the first board comprises:
    vias formed internally to connect the first bottom contact pads and the first top contact pads through the vertical walls.

12. The assembly of claim 10 wherein the first board comprises:
    a metal plane between the first top and bottom surfaces.

13. The assembly of claim 10 wherein the interconnecting element further comprises:
    an adhesive layer on the first bottom surface in the cavity to attach to the second device.

14. The assembly of claim 10 wherein the first board is made of a flame retardant (FR) woven glass reinforced epoxy resin of type 4 (FR-4).

15. The assembly of claim 10 wherein the first top and bottom contact pads are made of copper.

16. The assembly of claim 10 wherein at least one of the first and second devices is a ball grid array (BGA) device.

17. The assembly of claim 10 wherein the adhesive layer provides control of co-planarity when the first board is attached to a flat surface.

18. The assembly of claim 10 wherein the first bottom contact pads are formed within the bottom side of the vertical walls.

19. The assembly of claim 10 further comprising:
    a second board having second top and bottom surfaces and internal traces, the second top surface having second top contact pads to attach to the first bottom contact pads of the interconnecting element and contacts of the second device, the second bottom surface having second contact pads to attach to a printed circuit board, the internal traces connecting the first bottom contact pads to the contacts of the second device.

20. The assembly of claim 19 wherein the second board has a size matched with size of the first board.

21. The assembly of claim 19 wherein the second contact pads match the contacts of one of the first and second devices.

* * * * *